(12) United States Patent
Mohn et al.

(10) Patent No.: US 7,414,273 B2
(45) Date of Patent: Aug. 19, 2008

(54) TWO-DIMENSIONAL SILICON CONTROLLED RECTIFIER

(75) Inventors: Russell Mohn, Brooklyn, NY (US); Cong-Son Trinh, Meaux (FR); Phillip Czeslaw Jozwiak, Plainsboro, NJ (US); John Armer, Middlesex, NJ (US); Markus Paul Josef Mergens, Ravensburg (DE)

(73) Assignees: Sarnoff Corporation, Princeton, NJ (US); Sarnoff Europe, Gistel (BG)

( * ) Notice: Subject to any disclaimer, the term of this patent is extended or adjusted under 35 U.S.C. 154(b) by 125 days.

(21) Appl. No.: 11/176,975

(22) Filed: Jul. 7, 2005

(65) Prior Publication Data

US 2006/0011939 A1    Jan. 19, 2006

Related U.S. Application Data

(60) Provisional application No. 60/585,934, filed on Jul. 7, 2004.

(51) Int. Cl.
*H01L 29/74* (2006.01)
*H01L 31/111* (2006.01)

(52) U.S. Cl. .................. 257/122; 257/162; 257/165; 257/172

(58) Field of Classification Search .............. 257/122, 257/162, 172, 141, 144, 152, 165
See application file for complete search history.

(56) References Cited

U.S. PATENT DOCUMENTS

| 3,974,461 | A | 8/1976 | Luce ........................ 332/17 |
| 4,106,384 | A | 8/1978 | Whittington et al. ........ 84/1.19 |
| 4,236,434 | A | 12/1980 | Nishibe .................... 84/1.19 |
| 4,649,785 | A | 3/1987 | Chapman .................. 84/1.19 |
| 6,097,066 | A | 8/2000 | Lee et al. |
| 6,258,634 | B1 | 7/2001 | Wang et al. |
| 6,410,965 | B1 | 6/2002 | Yu |
| 7,064,393 | B2 * | 6/2006 | Mergens et al. ............ 257/360 |

OTHER PUBLICATIONS

R.G. Keen, Guitar Effects FAQ, May 20, 2000, 2 pages.
Scott Lehman, Harmony Central—Chorus, 1996, 5 pages.
Scott Lehman, Harmony Central—Flanging, 1996, 6 pages.
Ken Westover, 01/W Panning, Oct 14, 2000, 4 pages.

* cited by examiner

*Primary Examiner*—Shouxiang Hu
(74) *Attorney, Agent, or Firm*—Lowenstein Sandler PC (57) ABSTRACT

A two-dimensional silicon controlled rectifier (2DSCR) having the anode and cathode forming a checkerboard pattern. Such a pattern maximizes the anode to cathode contact length (the active area) within a given SCR area, i.e., effectively increasing the SCR width. Increasing the physical SCR area, increases the current handling capabilities of the SCR.

8 Claims, 7 Drawing Sheets

TWO-DIMENSIONAL SILICON CONTROLLED RECTIFIER

CROSS-REFERENCE TO RELATED APPLICATIONS

This application claims benefit of U.S. provisional patent application Ser. No. 60/585,934, filed Jul. 7, 2004, which is herein incorporated by reference.

BACKGROUND OF THE INVENTION

1. Field of the Invention

Embodiments of the present invention generally relate to a silicon controlled rectifier (SCR) layout within an integrated circuit (IC) and, more particularly, to an SCR layout that maximizes the width/area ratio of an SCR layout.

2. Description of the Related Art

Silicon-controlled rectifiers (SCRs) find widespread use in many applications where a switched resistive path is desired. For example, SCRs find particular use in electrostatic discharge (ESD) circuits or devices that are placed between an output or input pad of an IC and ground. The ESD circuits provide a high resistance path through an SCR when the circuit being protected is operating normally, and provides a low resistance path from the pad to ground when an ESD event occurs. The ESD event triggers the SCR into a low resistance state that shunts ESD generated current from the pad to ground. In this manner, the circuit being protected is not damaged by the ESD event.

There are many variations of ESD circuits that utilize SCRs in this manner. Commonly assigned U.S. Pat. Nos. 6,768,616, 6,791,122, 6,850,397 and 6,909,149, which are incorporated herein by reference, describe a number of such ESD circuits.

Figure 1:
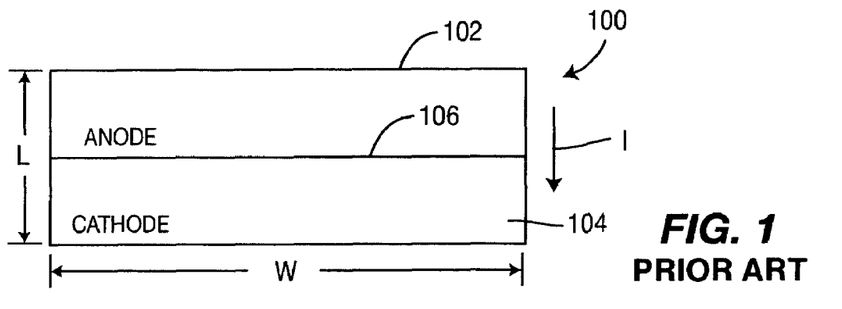
FIG. 1 is a simplified top plan view of a conventional 1-sided SCR.

In conventional SCRs, the amount of current that can be handled by an SCR is proportional to the width of the SCR. FIG. 1 depicts a simplified top plan view of a 1-sided SCR 100. The SCR comprises an anode 102 and a cathode 104 that abut one another along an active area 106. As is well known in the art, the SCR 100 is generally formed of a PNPN device, the details of which are well-known and not shown in this simplified view. The SCR 100 has a length L and a width W. When the SCR 100 is not triggered, the SCR has a high resistive path from the anode 102 to cathode 104. Conversely, when the SCR 100 is triggered in a low resistance state, current I flows from the anode 102 to the cathode 104 along the width W of the SCR 100, i.e., along the active area 106. The wider the SCR width W, the wider the active area 106 and the higher the current handling capability of the SCR. Since the depth of the SCR 100 is fixed by the IC manufacturing parameters, the current handling ability of the SCR is solely controlled by the SCR width W. In an ESD circuit, an ESD circuit designer selects an SCR width that provides a suitable level of ESD protection against an ESD event.

Figure 2:
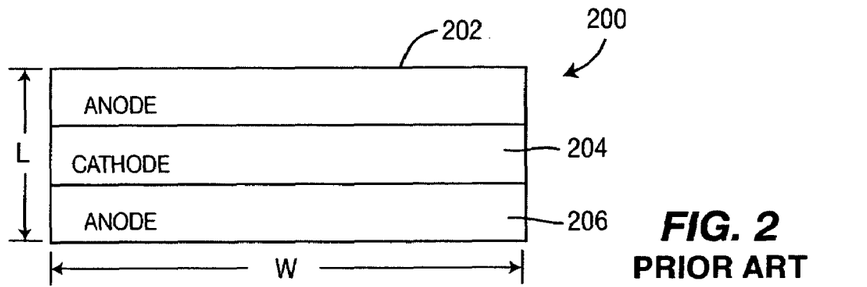
FIG. 2 is a simplified top plan view of a conventional 2-sided SCR.

To increase the current handling capability without increasing the physical width of the SCR, a 2-sided SCR may be used. FIG. 2 depicts a simplified top plan view of a 2-sided SCR 200 comprising a first anode 202, a cathode 204 and a second anode 206. The two anodes 202 and 206 abut the cathode 204 along active areas 208 and 210. When the SCR is active, current flows from both anodes 202, 206 into the cathode 204. As such, the effective width of the SCR is double that of the 1-sided SCR. As with the 1-sided SCR, an ESD designer controls the current handling level by adjusting the physical width W of the SCR 200.

If the region of the circuit in which the SCR is formed has limited space for the SCR width, the designer may not be able to achieve the width of the SCR that is necessary for the desired current handling capability. The result will be a compromised design.

Therefore, there is a need in the art for increasing the current handling capability of an SCR without increasing the physical width of the SCR, i.e., increasing the current handling for a given SCR area.

SUMMARY OF THE INVENTION

The present invention is a two-dimensional silicon controlled rectifier (2DSCR) having the anode and cathode forming a checkerboard pattern. Such a pattern maximizes the anode to cathode contact length (the active area) within a given SCR area, i.e., effectively increasing the SCR width. Increasing the physical SCR area, increases the current handling capabilities of the SCR.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is a two-dimensional silicon controlled rectifier (2DSCR) having an anode and cathode arranged in a checkerboard pattern. Such a pattern increases the effective width of the SCR and enables the current handling capability to be controlled by the area of the SCR, i.e., in two-dimensions.

Figure 3:
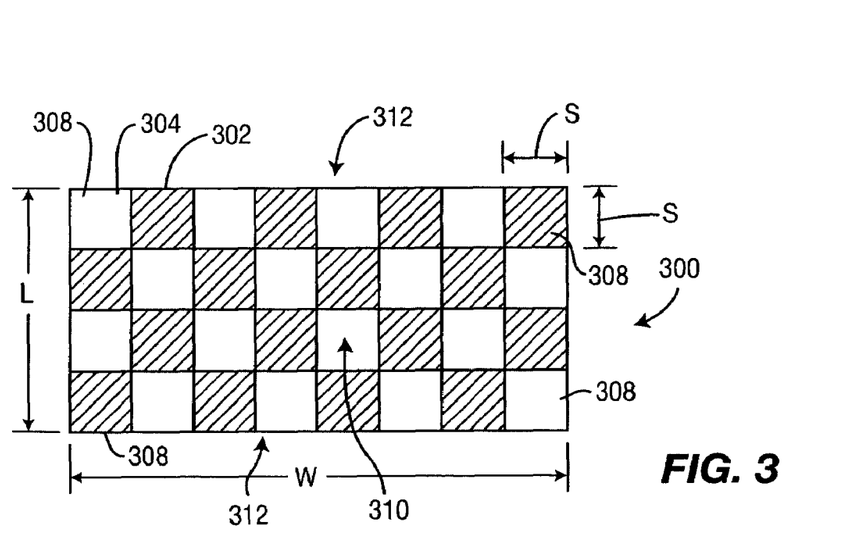
FIG. 3 is a simplified top plan view of the two-dimensional SCR (2DSCR) of the present invention.

FIG. 3 depicts a simplified top plan view of a 2DSCR 300 comprising a plurality of anodes 302 and cathodes 304 arranged in a checkerboard pattern. Each anode 302 and cathode 304 is substantially square where the active edges of the anode and cathode regions are substantially equal in length. Such a structure provides functional uniformity. However, in some designs, an asymmetric function may be desirable such that rectangular or other shaped anode and cathode regions may be used.

The anodes and cathodes are positioned alternately next to each other in rows and columns to form the checkerboard pattern. In a layer or layers above the pattern (but not shown in FIG. 3, an interconnect structure is used to interconnect all the anodes 302 and to interconnect all the cathodes 304 to create a practical SCR device. Such interconnect structures are well-known in the art.

When not triggered, the anode-cathode junctions (i.e., the active areas between the anodes and cathodes) operate in a high resistance state. However, when triggered, the junctions operate in a low resistance state and current will flow from the plurality of anodes into the plurality of cathodes. Depending upon the position within the SCR 300 for a particular anode or cathode, the anode or cathode will have two to fours sides that conduct current. For example, the corner elements 308 (anode or cathode) have 2 sides that contact neighboring elements, the center elements 310 have four sides contacting neighbors and the edge elements 312 have three sides contacting neighbors. Along each of the contact edges, an active area is formed and current will flow. In the depicted embodiment, there are 45 sides (of length S) that form active areas and facilitate current flow. Using a simple example, assuming each side is S units of length, the 2DSCR has 45S units of equivalent width. In a conventional 1-sided SCR, the width would be 8S units and a 2-sided SCR would have 16S units of width. Since the present invention uses the entire area of the SCR to enhance the effective width of the SCR, the effective width is far greater than has been achieved previously. However, in this simple example, it was assumed that current would flow along an entire side of an anode or cathode. Because of the structure of the N and P wells of the SCR, a junction region that forms the active areas consumes some of the side length S.

Figure 4:
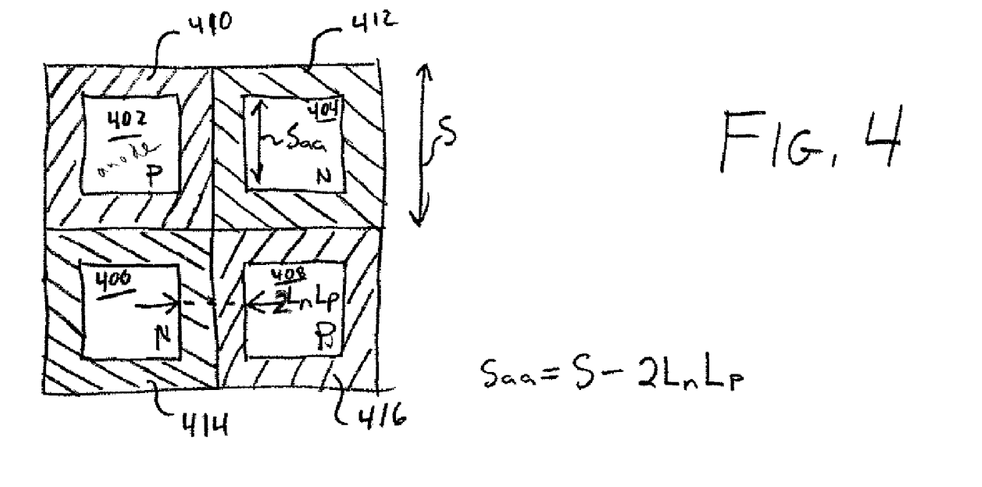
FIG. 4 is a top plan view of four wells of the 2DSCR of FIG. 3.

FIG. 4 depicts two P-type anodes 402 and 408 in an N-well 410 and 416, and two N-type cathodes 400 and 404 in a P-well 414 and 412 of the SCR 300 of FIG. 3. In addition, trigger taps (not shown) may be employed to enhance the operation of the SCR and be positioned within the anode and cathode regions. Such trigger taps are disclosed in detail in commonly assigned U.S. Pat. Nos. 6,768,616, 6,791,122, 6,850,397 and 6,909,149.

The actual SCR width must account for the distance that the anode or cathode is from the well edge. The distance from the P-type well 412/414 to the N-type cathode 404/400 is referred to as Ln, and the distance from the N-type well 410/416 to the P-type anode 402/408 is referred to as Lp. When both distances are equal, they are concatenated to form distance LnLp. In the simplified layout of FIG. 4, the well edges are shown as contributing to the SCR width. These distances are used to find the actual width of the SCR. The actual element width (Saa) that contributes to current flow is the well edge length S minus 2LnLp, or Saa=S−2LnLp. Summing the widths Saa of all the elements that abut one another provides an overall effective width of the 2DSCR.

Figure 5:
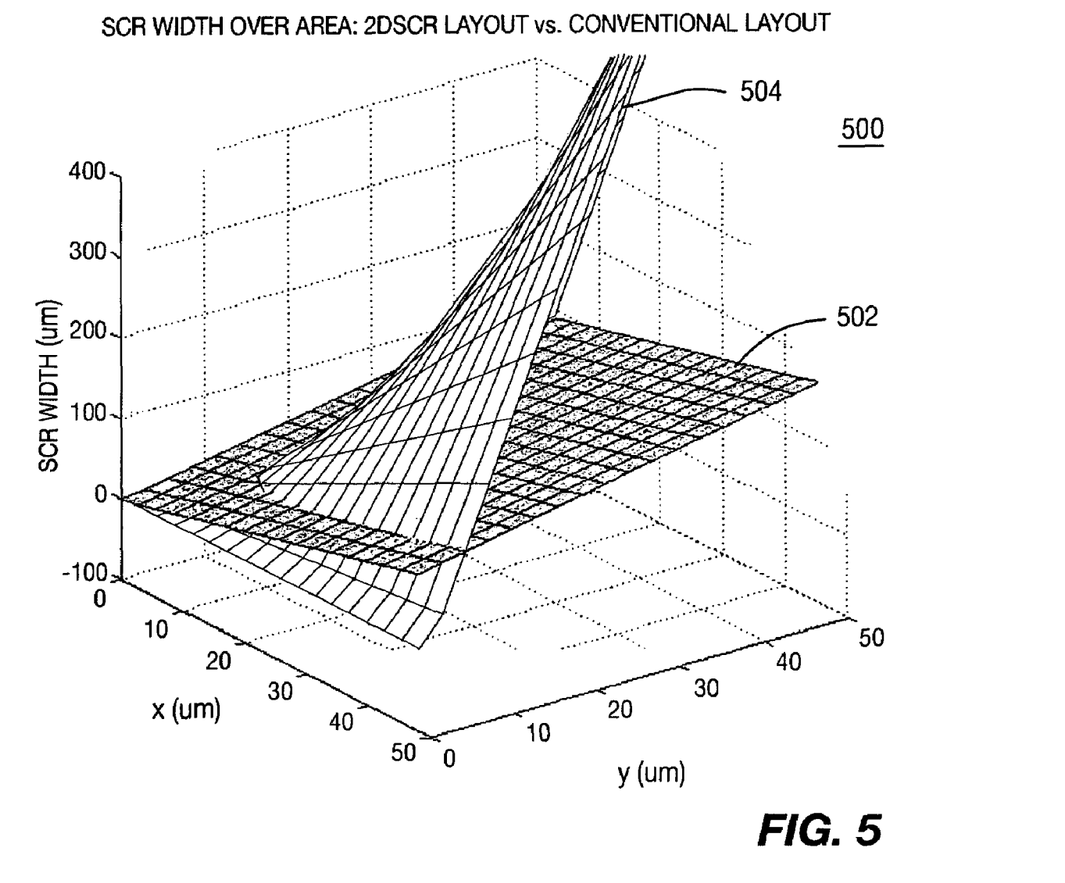
FIG. 5 depicts a graph of the width/area ratio of a 2DSCR compared to a conventional 1-sided SCR.

After adjusting for LnLp, the total effective width of the SCR 300 was calculated as a function of the SCR's area to produce a graph. FIG. 5 depicts a graph 500 of the area of the SCR, represented by the XY-plane bounded by the X-axis and Y-axis, as well as the SCR width, represented by the Z-axis. Surface 502 represents the SCR width of a conventional 2-sided SCR. In contrast, surface 504 represents the SCR width for a 2DSCR of the present invention. As is clearly shown, for some minimum value of X and Y, the width of the 2DSCR increases much faster than the conventional SCR. As such, a much greater effective width can be generated for a given SCR are using the 2DSCR. For this graph, S=2.82 um and LnLp=0.31 um.

Figure 6:
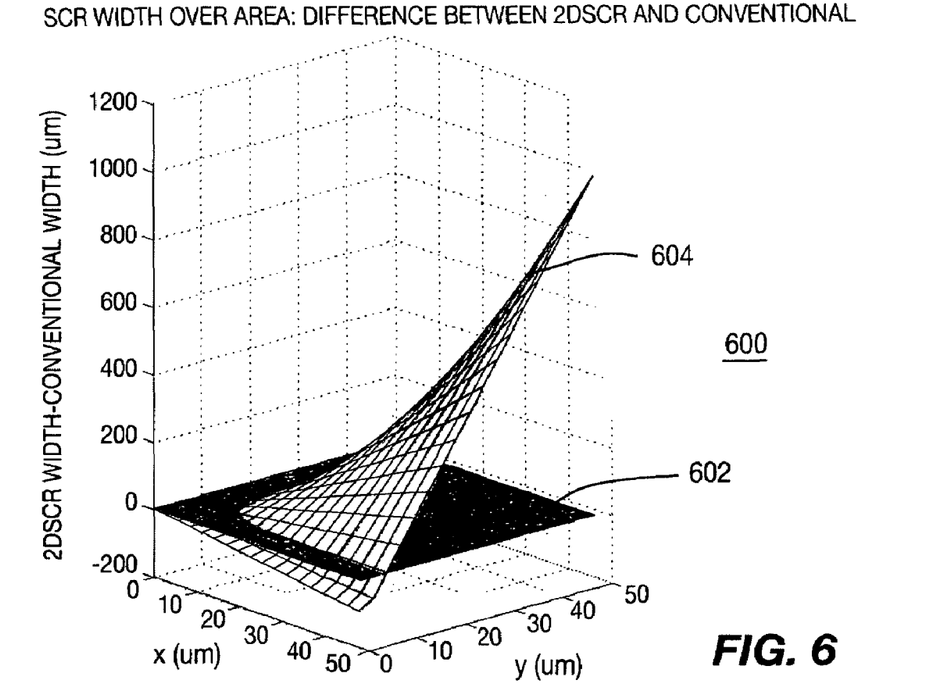
FIG. 6 depicts a graph of the width/area ratio of a 2DSCR compared to a conventional 2-sided SCR.

To emphasize the dramatic increase in width for the 2DSCR versus a conventional SCR, FIG. 6 depicts a graph 600 of the difference 604 between surfaces 502 and 504 of FIG. 5. The Z-plane is shown as surface 602 to provide a reference.

Figure 7:
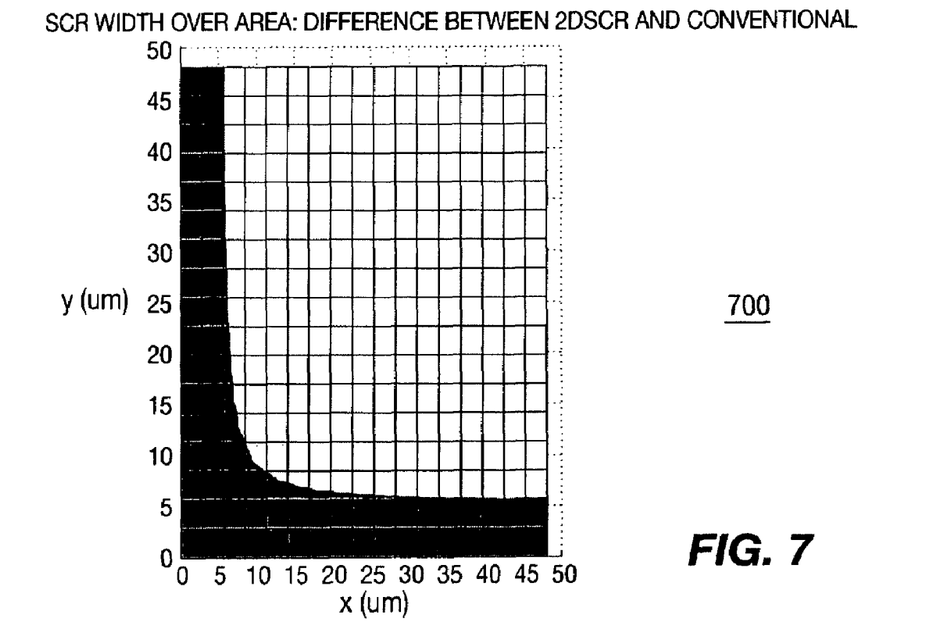
FIG. 7 depicts a top view of width/area ratio of a 2DSCR compared to a conventional 2-sided SCR, where S=2.82 um and LnLp=0.31 um.

FIG. 7 depicts a graph 700 of the difference between SCR widths as if looking down into the XY-plane. In this example, S=2.82 um and LnLp=0.31 um. For X and Y dimensions of the SCR area that are greater than 8 um, the 2DSCR layout provides a greater SCR width than the conventional 2-sided SCR layout. In practical SCRs, the dimensions of X or Y is generally larger than 20 um, the 2DSCR layout is advantageous in nearly all practical implementations of SCRs.

Figure 8:
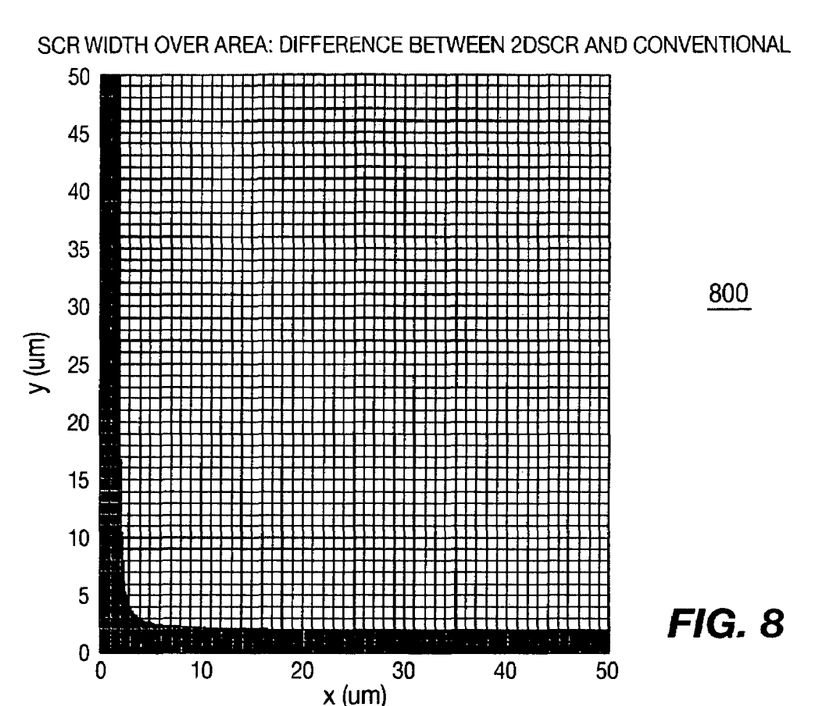
FIG. 8 depicts a top view of width/area ratio of a 2DSCR compared to a conventional 2-sided SCR, where S=2.0 um and LnLp=0.1 um

FIG. 8 depicts a graph 800 of the difference between SCR widths as if looking down into the XY-plane, where in this example, S=1.0 um and LnLp=0.1 um. Note that on this smaller scale, the 2DSCR is advantageous over the conventional SCR when the X and Y dimensions of the SCR area are greater than 2.5 um.

Figure 9:
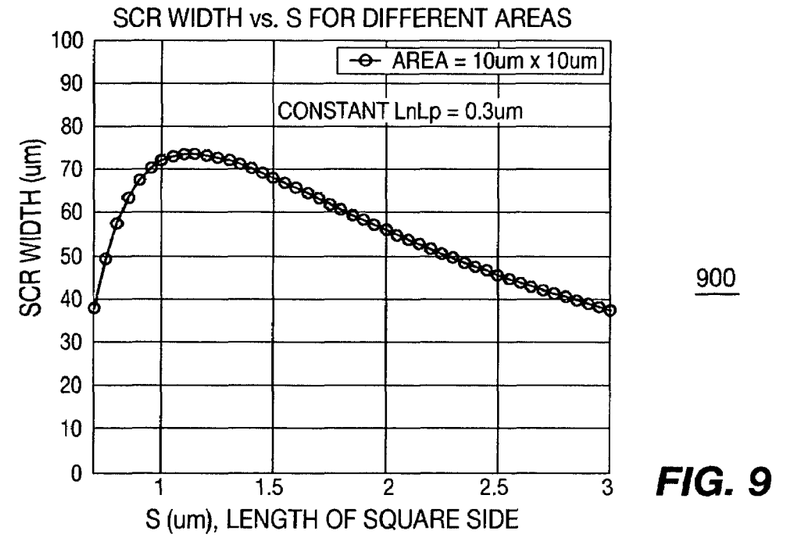
FIG. 9 depicts a graph of the SCR width as a function of S for a 2DSCR.

FIG. 9 depicts a graph 900 of SCR width as a function of S with the SCR area being constant, e.g., 10 um×10 um. Such a graph can be used to identify the optimal value of S given a fixed area and LnLp. In the graph of FIG. 9, the area is 100 um$^2$ and LnLp=0.3 um. The optimal width is 1.15 um. Using this graphical analysis, an optimal width value can be found for pairs of area and LnLp values. For example:

| X (um) | Y (um) | Optimal S (um) |
|---|---|---|
| 10 | 10 | 1.15 |
| 100 | 10 | 1.15 |
| 1000 | 10 | 1.15 |
| 1000 | 100 | 1.2 |
| 1000 | 1000 | 1.2 |

Figure 10:
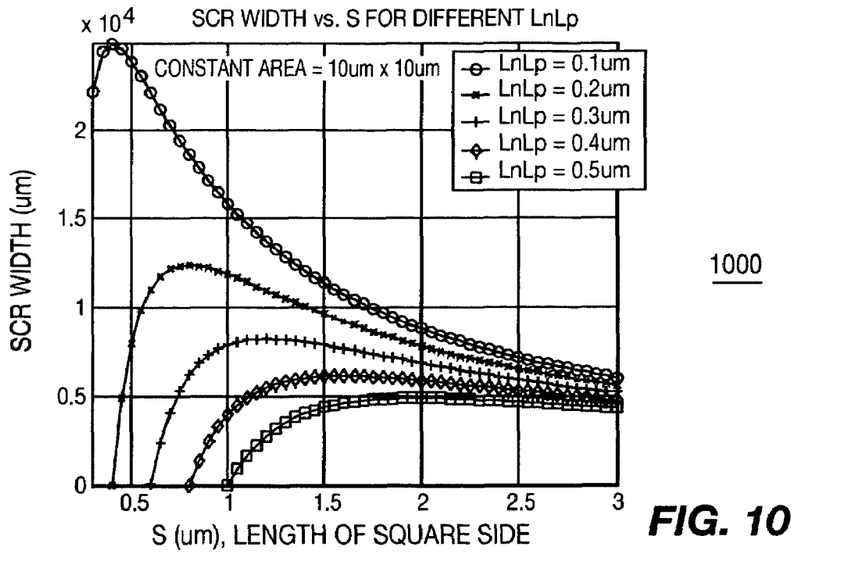
FIG. 10 depicts a graph of the SCR width as a function of S for a 2DSCR using a plurality of LnLp values.

FIG. 10 depicts a graph 1000 of the SCR width as a function of S, where the area is held constant. Each of the curves corresponds to a different value of LnLp, varying from 0.1 um to 0.5 um. As the value of LnLp increases, the value of S that optimizes the SCR width also increases.

Figure 11:
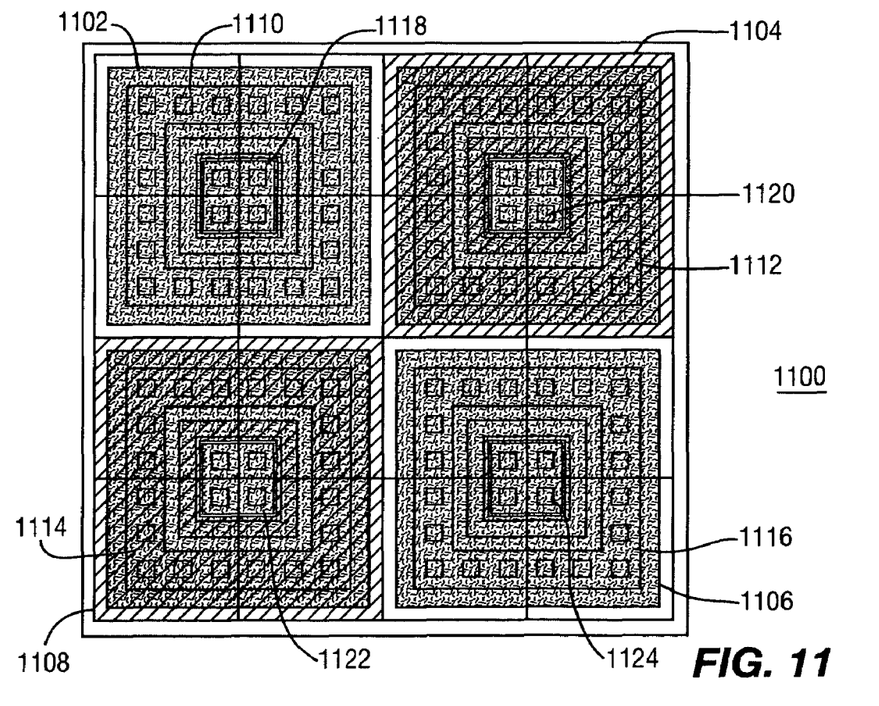
FIG. 11 depicts a top plan view of an exemplary layout of an SCR fabricated in accordance with the present invention.

FIG. 11 is a 2DSCR layout 1100 comprising two wells 1102, 1106 having anodes 110, 1116 and two wells 1104, 1116 having cathodes 1112 and 1114 created using a TSMC 0.13 um fabrication process. The TSMC 0.13 um process is a widely used, deep sub-micron IC manufacturing process. The layout 1100 has S=2.82 um and LnLp=0.31 um. The pattern can be expanded in both X and Y directions by adding more wells to achieve a desired SCR width. Also, in this layout 1100, the center of each anode and cathode regions contain a trigger taps 1118, 1120, 1122, 1124. These trigger taps may be located in either the anode, cathode or both.

Figure 12:
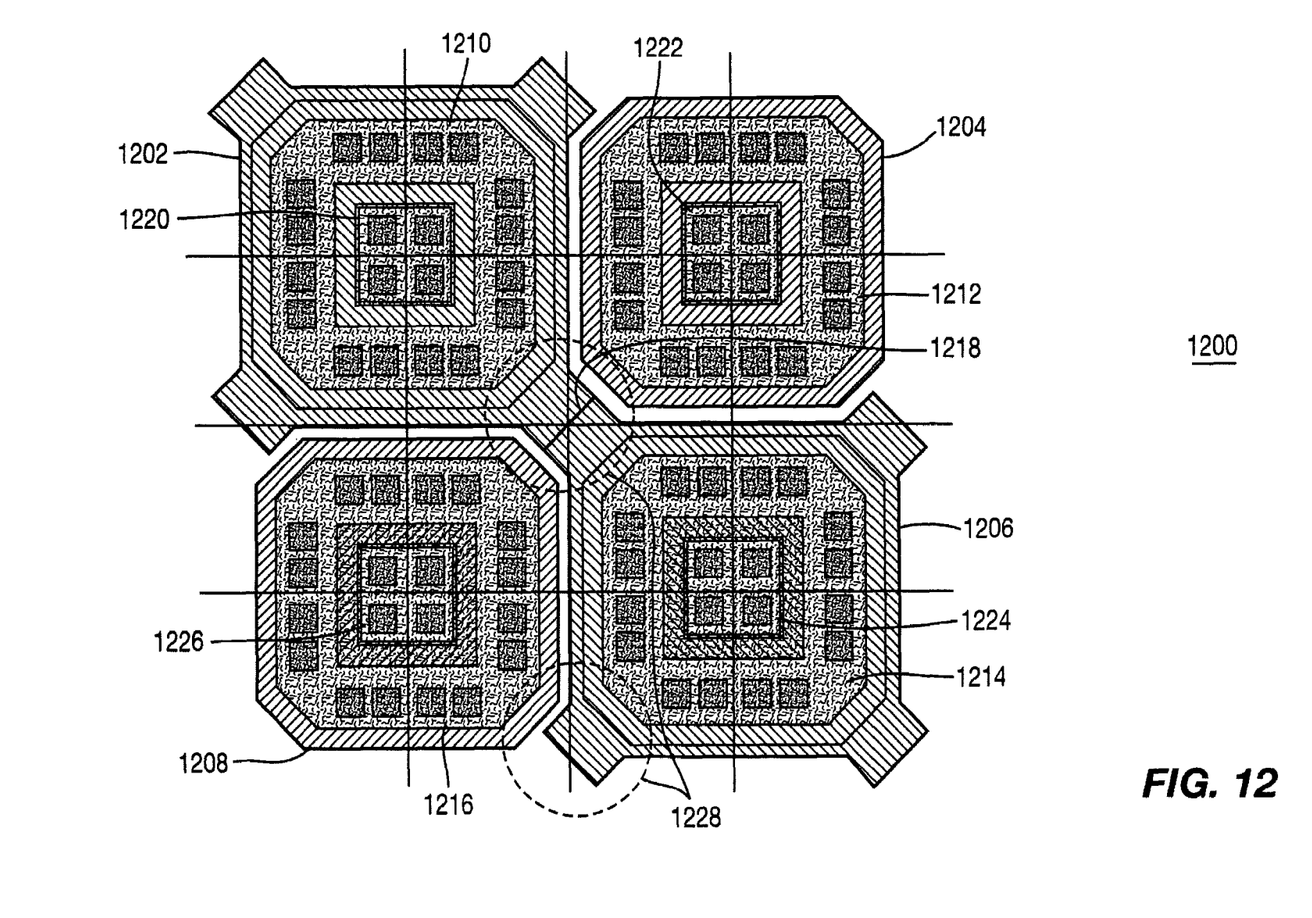
FIG. 12 depicts a top plan view of a second exemplary layout of an SCR fabricated in accordance with the present invention.

As a matter of practicality, sometimes manufacturing rules prohibit corner-to-corner contact of shapes within a common layer, i.e., corners of wells. To enhance manufacturability, the corners of one conductivity type well can be altered to create an acceptable geometric shape, e.g., a polygon. FIG. 12 depicts a 2DSCR layout 1200 comprising two wells 1202, 1206 having anodes 1210, 1216 and two wells 1204, 1216 having cathodes 1212 and 1214 that are manufacturable using a TSMC 0.13 um fabrication process. In the depicted embodiment, the N-wells are connected at the corners (region 1218). Of course, in an alternative embodiment, the P-wells may be connected at the corners in the same manner. In this layout 1200, trigger taps 1220, 1222, 1224, 1226 are depicted at the center of the anode region and the cathode region. Alternatively, the taps can be in either the anode, cathode or both. In a further alternative, trigger taps can be added to the well corner areas 1228. The type and position of the trigger taps are selected to support the application of the SCR.

While the foregoing is directed to embodiments of the present invention, other and further embodiments of the invention may be devised without departing from the basic scope thereof, and the scope thereof is determined by the claims that follow.

What is claimed is:

1. A silicon controlled rectifier (SCR) comprising:
    a plurality of anodes within a plurality of N-type material wells, respectively;
    a plurality of cathodes within a plurality of a P-type material wells, respectively;
    where the anodes and cathodes are arranged in an area of an integrated circuit in a checkerboard pattern, wherein each of the anodes comprises a P-type material and each of the cathodes comprises an N-type material;
    an N-type material trigger tap positioned directly in the N-type material well of each of the anodes,
    wherein the N-type material wells and the P-type material wells are substantially same in size and shape, and arranged alternately along each of two main directions that are substantially perpendicular to each other.

2. The SCR of claim 1, wherein each of the anodes and cathodes in the pluralities of anodes and cathodes has a substantially square plan form.

3. The SCR of claim 1, wherein each of the anodes and cathodes in the plurality of anodes and cathodes has a polygonal plan form.

4. The SCR of claim 1, further comprising a P-type trigger tap positioned in the P-type material well of each of the cathodes.

5. The SCR of claim 1, wherein either the P-type material wells of the cathodes or the N-type material wells of the anodes are connected.

6. The SCR of claim 1, wherein a width of an active area that contributes to current flow from the anode to the cathode is defined by a well edge length minus Ln and Lp, wherein the well edge length is a physical length of the P-type material well or the N-type material well, Ln is a distance from an edge of the P-type well to an edge of the N-type cathode, and Lp is the distance from an edge of the N-type well to an edge of the P-type anode.

7. The SCR of claim 6, wherein a summation of the widths of the active areas produces an effective width of the SCR.

8. The SCR of claim 6, wherein the active area defines a current handling capability of the SCR.

* * * * *

UNITED STATES PATENT AND TRADEMARK OFFICE
CERTIFICATE OF CORRECTION

PATENT NO. : 7,414,273 B2  Page 1 of 1
APPLICATION NO. : 11/176975
DATED : August 19, 2008
INVENTOR(S) : Russell Mohn et al.

It is certified that error appears in the above-identified patent and that said Letters Patent is hereby corrected as shown below:

On the face of the patent, item (73), please make the following changes:

1-after "Sarnoff Europe," insert --BVBA--

2-after "Gistel," correct the country initials from "(BG)" to "(BE)"

Signed and Sealed this

Twenty-third Day of February, 2010

David J. Kappos
*Director of the United States Patent and Trademark Office*